United States Patent [19]
Akins et al.

[11] Patent Number: 5,344,729
[45] Date of Patent: Sep. 6, 1994

[54] CONFORMAL PHOTOMASK FOR THREE-DIMENSIONAL PRINTED CIRCUIT BOARD TECHNOLOGY

[75] Inventors: Rickey D. Akins; John Walvoord; James E. Foreman, all of Orlando, Fla.

[73] Assignee: Martin Marietta Corporation, Bethesda, Md.

[21] Appl. No.: 904,948

[22] Filed: Jun. 26, 1992

[51] Int. Cl.$^5$ ................................................. G03F 9/00
[52] U.S. Cl. ......................................... 430/5; 430/258; 430/313; 430/314; 430/257; 343/873
[58] Field of Search ................... 430/5, 257, 269, 311, 430/321, 323, 319, 313, 314, 258; 343/873

[56] References Cited
U.S. PATENT DOCUMENTS

| | | | |
|---|---|---|---|
| 4,388,388 | 6/1983 | Kornbau et al. | 430/5 |
| 4,780,177 | 10/1988 | Wojnarowski et al. | 156/643 |
| 4,842,677 | 6/1989 | Wojnarowski et al. | 156/643 |
| 4,870,751 | 10/1989 | Antoon | 29/846 |

*Primary Examiner*—Steve Rosasco
*Attorney, Agent, or Firm*—Burns, Doane Swecker & Mathis

[57] ABSTRACT

In a method for fabricating a reusable conformal photomask for a doubly contoured hemispherical substrate such as a radome or a three-dimensional printed circuit board, a light blocking material is deposited on a shell or tool corresponding to the shape of the radome or printed circuit board. A pattern is then formed in the light blocking material, and portions of the light blocking material corresponding to the pattern are removed. The resulting pattern corresponds to the pattern to be formed on the three-dimensional printed circuit board or radome. A light transmissive layer is then deposited over the light blocking layer for support. The light blocking material and the light transmissive material comprise the reusable conformal photomask which is then removed from the shell. The reusable conformal photomask can be used to form an image of the desired pattern on the three-dimensional printed circuit board or radome.

14 Claims, 3 Drawing Sheets

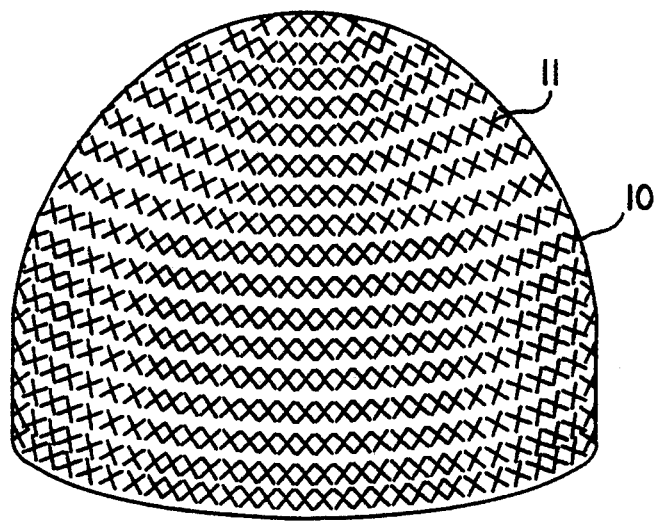
FIG. IA
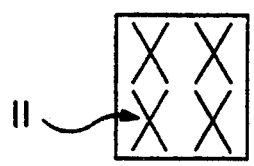
FIG. IB

CONFORMAL PHOTOMASK FOR THREE-DIMENSIONAL PRINTED CIRCUIT BOARD TECHNOLOGY

FIELD OF THE INVENTION

The present invention relates generally to a method for fabricating a photomask. More particularly, the present invention relates to a reusable three-dimensional conformal photomask for use in fabricating three-dimensional printed circuit boards or radomes.

BACKGROUND OF THE INVENTION

A radome is a housing for an antenna, radar or any type of seeker, and it is typically found on aircraft, missiles, submarines, moving vehicles or used in land or space based communications systems. A radome housing may include shapes such as a hemisphere, ogive, cone, cube, etc. A radome includes a frequency selective surface (FSS) which allows predetermined frequencies to pass through the housing, and it prevents undesired frequencies from penetrating the housing. When a FSS is used as a reflecting surface, it allows all frequency bands except one to pass, e.g., a bandstop reflector. The inverse of a bandstop is a bandpass. Frequency selective surfaces have been produced in much the same way as printed circuit boards. The main difference is that the FSS is usually printed on a three-dimensional doubly curved structure as in the case of a radome.

Presently, three-dimensional printed circuit boards and radomes are fabricated using a planar or substantially two-dimensional photomask. For example, a photoresist coating is applied to a three-dimensional metal surface, such as copper, which is disposed upon an underlying substrate. A substantially two-dimensional photomask of an element of a pattern is created using photolithography techniques. The element image of the two-dimensional photomask is transferred to a substantially planar portion of the photoresist coating using a standard incoherent ultraviolet (UV) light source. The process is repeated until all the element images have been formed in the photoresist coating. A photodeveloper removes the photoresist and exposes the image which allows acid etching of the copper surface to create the final pattern.

One possible method for transferring the element image to the substantially planar portion of the photoresist material is to use a contact imaging technique. The substantially two-dimensional photomask of an individual element is disposed in a contact imaging head. The illumination from the incoherent light source is directed into the contact imaging head, and the illumination forms an element image in a substantially planar portion of the photoresist material. The contact imaging head is repeatedly moved and stopped in each substantially planar portion of the photoresist material until the pattern is completely formed across the entire three-dimensional surface of the photoresist material.

The contact imaging technique described above is extremely slow, because the imaging head has to be physically moved and stopped in each substantially planar portion of the photoresist material to form an individual element of the pattern. Accordingly, there is a need for a conformal photomask which can image the entire surface of the three-dimensional printed circuit board or radome at one time,

SUMMARY OF THE INVENTION

The present invention provides a method for fabricating a conformal photomask for a three-dimensional printed circuit board or radome. A rigid shell corresponding to the three-dimensional shape of the printed circuit board or radome is preferably fabricated using an electroforming technique. The three-dimensional rigid or metal shell is coated with a light blocking material. Selected portions or elements of the light blocking material corresponding to the desired pattern are removed. A light transmissive material is then applied to the light blocking material to provide support, The light transmissive material and the light blocking material which comprise the conformal photomask are removed from the three-dimensional rigid shell, The resulting three-dimensional conformal photomask can then be used to fabricate a three-dimensional printed circuit board or radome.

BRIEF DESCRIPTION OF THE DRAWINGS

FIG. 1A is a perspective view of a radome which can be fabricated using the conformal photomask of the present invention;

FIG. 1B is an illustration of a portion of the surface of the radome of FIG. 1A;

DETAILED DESCRIPTION OF THE INVENTION

Figure 2:
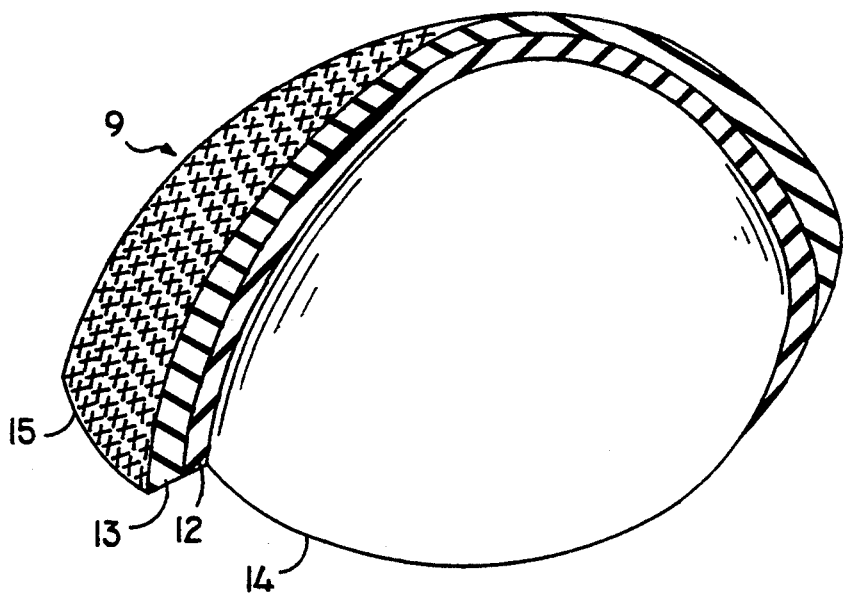
FIG. 2 is a partial cross-section of the conformal photomask made in accordance with first and second embodiments of the present invention.

The present invention is a method for fabricating a reusable conformal photomask for use in the production of three-dimensional printed circuit boards. The conformal photomask also has use in other advanced technologies such as radome manufacture. Printed circuit boards are now being applied to three-dimensional surfaces in the electronics industry. There is a lack of a cost effective method of applying these circuits to complex curved surfaces. Prior to the development of the present invention, two-dimensional printed circuit board patterns were fabricated and then applied or laminated to a three-dimensional surface. However, a two-dimensional pattern cannot be accurately and uniformly positioned onto a three-dimensional surface without dimensional and discontinuity problems arising. The development of the present invention assures improved accuracy and performance characteristics in the manufacture of three-dimensional printed circuit boards and radomes.

Referring now to FIG. 1A, a perspective view of a radome 10 is illustrated. The radome 10 is typically a hemispherically shaped ogive surface, or a doubly contoured surface made from a polymer substrate having a metallized layer with selective portions of the metallized layer removed. A typical radome 10 may have a hemispherical shape measuring 8 inches in diameter and 5 inches in height, and it may have 8,000 or more elements or x-shaped slots 11. In FIG. 1A, the slots 11 are preferably x-shaped slots. Alternatively, the slots 11 could be y-shaped slots. The radome 10 is capable of selectively passing desired frequencies through the slots 11 or openings in the metallized layer. The polymer layer of the radome can be injection molded from a polycarbonate or other material, and the metallizing layer can be fabricated using a process known as vapor deposition. In order to remove selected portions or elements 11 of the metallized layer, a positive photoresist material such as AZ135OJ can be used.

FIG. 1B illustrates an enlarged portion of the surface of the radome 10. The enlarged portion includes four x-shaped slots 11. The slots 11 are disposed around the surface of the radome 10 in a spiral fashion. The x-shaped slots 11 are also arranged such that the distal ends of each x are in close proximity to the distal ends of each adjacent x-shaped slot. Such an arrangement allows the x-shaped slots 11 to be densely, and efficiently distributed across the surface of the radome 10.

The techniques for fabricating the conformal photomask of the present invention are similar to those for fabricating the three-dimensional printed circuit board or radome. The basic design behind the conformal photomask is to produce a three-dimensional semi-rigid structure that has a light blocking layer which conforms to the three-dimensional substrate to be imaged. The light blocking layer, which is supported by a light transmissive layer, makes intimate contact with the photoresist material coating of the three-dimensional substrate, such as a printed circuit board or radome. The inner layer of the conformal photomask blocks light in all areas of the three-dimensional substrate except where the material has to be removed to form a specific pattern for the printed circuit or radome. The outer transmissive layer of the conformal photomask allows for efficient passing of light and supports the inner layer of the conformal photomask.

Referring to FIG. 2, the first and second embodiments of the present invention will now be explained.

In the first embodiment of the present invention, a conformal photomask 9 includes a metal film 12 which acts as the light blocking layer and a semi-elastic light transmissive, organic coating 13 as the supporting layer. The conformal photomask 9 is fabricated by electroforming a metal shell 14 (mandrel) to the contour of the three-dimensional substrate to be imaged. Preferably, the electroformed shell 14 is made of nickel. The electroformed shell 14 is then electroplated with the light blocking metal film 12 which is preferably a thin layer of different metal, such as copper. Alternatively, the shell 14 could be electroformed from copper and the metal film 12 could be made from nickel. The metal film 12 is coated with a photoresist. An image of a specific pattern having a plurality of elements may be formed in the photoresist which coats the electroplated metal film 12 using a contact printing technique. The photoresist coated surface is then developed and the metal film 12 is acid etched to obtain the x-shaped elements 15 of the desire pattern in the metal film. The photoresist material is then removed. The light transmissive organic film 13 is applied to the imaged and etched metal film 14 by a spraying or dipping process. Preferably, the organic film 13 is perfluoroalkoxy (PFA) which can be sprayed electrostatically as a dry powder to a hot tool which causes it to melt fuse. Alternatively, the organic film 13 could be Viton which is a liquid that is electrostatically sprayed and lacquer cures. Finally, the electroformed metal shell 14 is removed from the organic film 13 and the electroplated film 12 which comprise the conformal photomask 9. The resulting three-dimensional conformal photomask 9 having y-shaped elements 15 is reusable.

In the second embodiment of the present invention, the conformal photomask 9 is made by applying a thin layer of metal 12 to a release tool 14 that has the same contour as the desired three-dimensional substrate. The metal film 12 is then coated with a photoresist and contact imaged as described above. The photoresist is developed, and the surface of the metal film 12 is acid etched to obtain the desired pattern having x-shaped elements 15. The photoresist is removed. The tool 14 and the metal film 12 are then placed in a thermoforming unit where a light transmissive coating 13 is thermoformed onto the patterned surface of the metal film 12. Preferably, the thermoformed light transmissive material 13 is either polyethylene or polypropylene. Any thermoformed material having the appropriate wavelength characteristics should suitable. Upon cooling, the thermoformed coating 13 is removed from the tool with the patterned metallic film 12 embedded.

Figure 3:
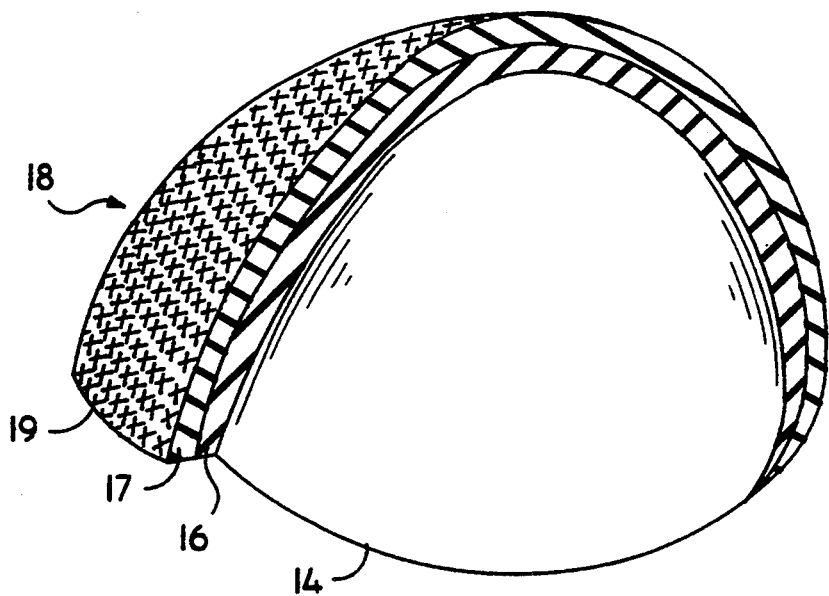
FIG. 3 is a partial cross-section of the conformal photomask made in accordance with the third embodiment of the present invention.

Referring to FIG. 3, the third embodiment of the present invention will now be explained. In the third embodiment, there are two organic coatings 16, 17. The organic coating 16 is light blocking, and the organic coating 17 is light transmissive. In this embodiment, the coatings are applied over the electroformed mandrel 14. The light blocking organic coating 16 is first applied to the mandrel 14 via electrostatic spraying. Preferably, the light blocking coating 16 is polyphylenesulfide (PPS). Specific areas of the coating 16 are preferably ablated away by repeatedly using an excimer laser and a two-dimensional photomask corresponding to an individual element 19, thereby creating the desired pattern of y-shaped elements 19. A method and device for performing the ablation is described in the copending U.S. Patent application Ser. No. 07/901,789 entitled "Ablative Process for Printed Circuit Board Technology", filed on Jun. 22, 1992, in the names of Akins et al, and assigned to the assignee of the present application. The light transmissive coating 17 is then applied to the imaged coating 16 via electrostatic spraying. Preferably, the light transmissive material 17 is perfluoroalkoxy, or alternatively it could be polyethylenephthlate (PET). The two coatings 16, 17 are then removed from the mandrel 14 as one piece to obtain the three-dimensional conformal photomask 18.

Figure 4:
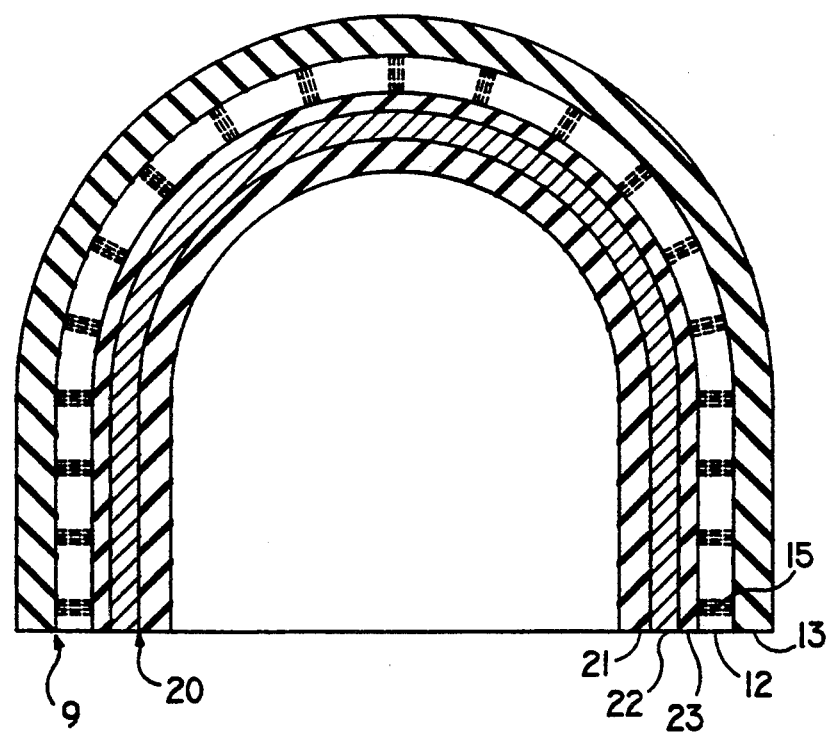
FIG. 4 is a cross-sectional view of the conformal photomask and a three-dimensional substrate.

Referring now to FIG. 4, the use of the conformal photomask 9 in fabricating a three-dimensional substrate 20 will be explained. In order to fabricate a three-dimensional printed circuit board or radome of the type illustrated in FIG. 1 using the three-dimensional conformal photomask 9, the conformal photomask is placed upon the three-dimensional substrate 20 covered with a photoresist material 23. The three-dimensional substrate 20 preferably includes a first or underlying polymer layer 21 covered by a second metallized layer 22, such as a copper surface. When the conformal photomask 9 is illuminated with a source of ultraviolet illumination, the light passes through the light transmissive layer 13 and the elements 15 of the light blocking layer 12 of the conformal photomask 9 and forms the image of the entire pattern of elements in the photoresist 23 covering the three-dimensional substrate 20. Once the image is formed, the conformal photomask 9 is removed, and the photoresist 23 covering the metallized surface of the three-dimensional substrate is sensitive to chemical processing that will allow for selective removal of the photoresist 23 based on the pattern. The photoresist coated material 23 is treated with a developing agent. The developing agent reacts with the photoresist 23 and selectively removes portions of the photoresist 23 based on the image cast. The underlying metallic layer 22 can be etched away in areas where the photoresist 23 has been removed, thus creating a selective pattern on the metallized surface 22.

The use of the conformal photomask of the present invention is a substantial improvement over the direct contact imaging of individual patterns onto a three-dimensional surface using a substantially two-dimensional photomask. The three-dimensional conformal photomask permits all of the elements of a pattern to be cast at once. The conformal photomask of the present invention drastically reduces the process time and improves the repeatability of the pattern among three-dimensional substrates. Furthermore, since an imaging device is not tied up producing three-dimensional substrates, it is available for producing additional conformal photomasks of the same design or different designs.

While the invention has been described in its preferred embodiments, it is to be understood that the words that have been used are words of description rather than of limitation, and that changes within the purview of the present claims may be made without departing from the true scope of the invention in its broader aspects.

We claim:

1. A method for fabricating a one piece three dimensional reusable conformal photomask for use in forming a predetermined pattern on a substantially nonplanar substrate, comprising:
   forming a rigid shell corresponding to the entire shape of the substantially nonplanar substrate;
   coating the entire rigid shell with a removable light blocking material;
   forming multiple images in the light blocking material by repeated image projection, such that portions of the light blocking material corresponding to the predetermined pattern to be formed on the entire substantially nonplanar substrate are removed through at least one removal process, including the removal processes of ablation and chemical removal; and
   applying a light transmissive material to the light blocking material.

2. A method according to claim 1 wherein the light blocking material ia a metal film and the portions of the metal film are removed by coating the metal film with a photoresist material, imaging the predetermined pattern into the photoresist material, and etching the portions of the metal film corresponding to the predetermined pattern.

3. A method according to claim 2 wherein the light transmissive material is applied to the light blocking material by a spraying or dipping process.

4. A method according to claim 2 wherein the light transmissive material is applied to the light blocking material using a thermoforming process.

5. A method according to claim 1 wherein portions of the light blocking material corresponding to the predetermined pattern are ablated using a coherent light source.

6. A method according to claim 5 wherein the light blocking material includes a first organic material and the light transmissive film includes a second organic material.

7. A method according to claim 6 wherein the first organic film is applied to the rigid shell by electrostatic spraying and the second organic film is applied to the first organic film after it has been ablated.

8. A reusable three dimensional conformal photomask formed in a one piece construction for use in forming a predetermined pattern on a substantially nonplanar substrate, comprising:
   a light blocking material, formed on a rigid shell corresponding to the shape of the substantially nonplanar substrate, portions of the light blocking material having multiple images formed therein by repeated image projection, such that the portions corresponding to the entire predetermined pattern to be formed on the entire substantially nonplanar substrate can be removed through at least one removal process, including the removal processes of ablation and chemical removal; and
   a light transmissive material which is applied to the light blocking material.

9. A reusable conformal photomask according to claim 8 wherein the light blocking material is a metal film and the portions of the metal film are removed by coating the metal film with a photoresist material, imaging the predetermined pattern into the photoresist material, and etching the portions of the metal film corresponding to the predetermined pattern.

10. A reusable conformal photomask according to claim 9 wherein the light transmissive material is applied to the light blocking material by a spraying or dipping process.

11. A reusable conformal photomask according to claim 9 wherein the light transmissive material is applied to the light blocking material using a thermoforming process.

12. A reusable conformal photomask according to claim 8 wherein portions of the light blocking material corresponding to the predetermined pattern are ablated using a coherent light source.

13. A reusable conformal photomask according to claim 12 wherein the light blocking material includes a first organic material and the light transmissive film includes a second organic material.

14. A reusable conformal photomask according to claim 13 wherein the first organic film is applied to the rigid shell by electrostatic spraying and the second organic film is applied to the first organic film after it has been ablated.

* * * * *